United States Patent [19]
DoMinh

[11] Patent Number: 5,962,189
[45] Date of Patent: *Oct. 5, 1999

[54] PHOTOSENSITIVE COMPOSITION CONTAINING PHOTOSENSITIVE POLYAMIDE AND THIAZOLINE PHOTOINITIATOR AND NEGATIVE WORKING PHOTOSENSITIVE ELEMENT

[75] Inventor: Thap DoMinh, Rochester, N.Y.

[73] Assignee: Kodak Polychrome Graphics LLC, Norwalk, Conn.

[*] Notice: This patent is subject to a terminal disclaimer.

[21] Appl. No.: 08/794,156

[22] Filed: Dec. 19, 1996

[51] Int. Cl.⁶ .......................... G03F 7/037; G03F 7/038; G03F 7/09; B41N 1/08
[52] U.S. Cl. ...................... 430/278.1; 430/283.1; 430/285.1; 430/920; 430/922; 430/926; 522/16; 522/26; 522/107
[58] Field of Search .............. 430/283.1, 285.1, 430/920, 922, 926, 278.1; 522/16, 26, 107

[56] References Cited

U.S. PATENT DOCUMENTS

| | | | |
|---|---|---|---|
| 2,732,301 | 1/1956 | Robertson et al. | 95/7 |
| 3,030,208 | 4/1962 | Scheilenberg | 96/35 |
| 3,622,320 | 11/1971 | Allen | 96/28 |
| 3,702,765 | 11/1972 | Laakso | 96/33 |
| 3,929,489 | 12/1975 | Arcesi et al. | 96/115 |
| 3,987,037 | 10/1976 | Bonham et al. | 260/240 |
| 4,062,686 | 12/1977 | Van Allan et al. | 96/115 R |
| 4,239,850 | 12/1980 | Kita et al. | 430/285.1 X |
| 4,258,123 | 3/1981 | Nagashima et al. | 430/285.1 X |
| 4,414,312 | 11/1983 | Goff et al. | 430/283.1 |
| 4,416,973 | 11/1983 | Goff | 430/281.1 |
| 4,454,220 | 6/1984 | Goff | 430/311 |
| 4,458,007 | 7/1984 | Geissler et al. | 430/284.1 |
| 4,481,276 | 11/1984 | Ishikawa et al. | 430/920 X |
| 4,505,793 | 3/1985 | Tamoto et al. | 204/159 |
| 5,045,432 | 9/1991 | West et al. | 430/278.1 |
| 5,061,600 | 10/1991 | West et al. | 430/273 |
| 5,085,975 | 2/1992 | Mueller | 430/285.1 |
| 5,141,842 | 8/1992 | Mitchell et al. | 430/285.1 |

FOREIGN PATENT DOCUMENTS 0453237  10/1991  European Pat. Off. .

*Primary Examiner*—Cynthia Hamilton
*Attorney, Agent, or Firm*—Ratner & Prestia

[57] ABSTRACT

A photosensitive composition can be used to prepare negative-working photosensitive elements such as lithographic printing plates. The composition includes a first photocrosslinkable aromatic resin having photocrosslinkable groups and a number average molecular weight of at least about 1500. Also included is a polymerizable monomer, a photocrosslinkable polyester, a photoinitiator, and an aromatic thiazoline photosensitizer. The photosensitive resins are present at a total weight ratio to the monomer of at least 1.5:1.

25 Claims, No Drawings

PHOTOSENSITIVE COMPOSITION CONTAINING PHOTOSENSITIVE POLYAMIDE AND THIAZOLINE PHOTOINITIATOR AND NEGATIVE WORKING PHOTOSENSITIVE ELEMENT

RELATED APPLICATIONS

Cofiled and commonly assigned U.S. Ser. No. 08/769,362, by Thap DoMinh, and entitled PHOTOSENSITIVE POLYMER COMPOSITION AND NEGATIVE WORKING PHOTOSENSITIVE ELEMENT CONTAINING THREE PHOTOCROSSLINKABLE POLYMERS.

Cofiled and commonly assigned U.S. Ser. No. 08/770,749, by Thap DoMinh and John Kalamen, and entitled PHOTOSENSITIVE POLYMER COMPOSITION CONTAINING PHOTOSENSITIVE POLYAMIDE AND NEGATIVE WORKING PHOTOSENSITIVE ELEMENT.

FIELD OF THE INVENTION

This invention relates to a photosensitive composition containing a mixture of photocrosslinkable polymers and a polymerizable monomer. Such compositions are useful in the production of photosensitive elements such as lithographic printing plates.

BACKGROUND OF THE INVENTION

The art of lithographic printing is based upon the immiscibility of oil and water, wherein the oily material or ink is preferentially retained by the image area and the water or fountain solution is preferentially retained by the non-image areas. When a suitably prepared surface is moistened with water and an ink is then applied, the background or non-image areas accept the ink and repel the water. The ink on the image areas is then transferred to the surface of a material in which the image is to be reproduced, such as paper or cloth.

Negative-working lithographic printing plates are prepared from negative-working radiation-sensitive compositions that are formed from polymers that crosslink in radiation-exposed areas. A developing solution is used to remove the unexposed areas of the plates to thereby form a negative image.

The most widely used type of negative-working lithographic printing plates comprises a layer of a radiation-sensitive composition applied to an aluminum substrate and commonly includes a subbing layer or interlayer to control the bonding of the radiation-sensitive layer to the substrate. The aluminum substrate is typically provided with an anodized coating formed by anodically oxidizing the aluminum in an aqueous electrolyte solution.

It is well known to prepare negative-working lithographic printing plates using a radiation-sensitive composition that includes a photocrosslinkable polymer containing the photosensitive group, —CH=CH—CO— as an integral part of the polymer backbone [see for example, U.S. Pat. No. 3,030,208 (Schellenberg et al), U.S. Pat. No. 3,622,320 (Allen), U.S. Pat. No. 3,702,765 (Laakso) and U.S. Pat. No. 3,929,489 (Arcesi et al)]. A very common commercially useful photocrosslinkable polymer in lithographic printing plates is a polyester prepared from diethyl p-phenylenediacrylate and 1,4-bis(β-hydroxyethoxy)-cyclohexane.

Polyesters in addition to Polymer A that are especially useful in the preparation of lithographic printing plates are those which incorporate ionic moieties derived from monomers such as dimethyl-3,3'-[(sodioimino)disulfonyl] dibenzoate and dimethyl-5-sodiosulfoisophthalate. Polyesters of this type are well known and are described, for example, in U.S. Pat. No. 3,929,489 (Arcesi). A preferred polyester of this type, known in the art as "Polymer B", is poly[1,4-cyclohexylene-bis(oxyethylene)-p-phenylenediacrylate]-co-3,3'[(sodioimino)disulfonyl] dibenzoate. Another preferred polyester of this type is known in the art as "Polymer C" and is defined as poly[1,4-cyclohexylene-bis(oxyethylene)-p-phenylenediacrylate]-co-3,3'-[(sodioimino)disulfonyl]dibenzoate-co-3-hydroxyisophthalate.

Various other photocrosslinkable polymers are known for use in lithographic printing plates including the polyimide precursors described in U.S. Pat. No. 4,416,973 (Goff). Such compositions are known for durability, chemical resistance, adhesion to metals and high mechanical strength when photocrosslinked. Well-known sensitizers including coumarins and halogenated triazines, as described for example in U.S. Pat. No. 4,505,793 (Tamoto et al), can also be used in photocrosslinkable compositions.

There is a need to provide a highly durable negative-working lithographic printing plate that is simple to make and use. Thus, it would be desirable to have plates having a single layer which is a photocrosslinkable layer that has very high sensitivity.

Unfortunately, photopolymerizable compositions using acrylate monomers and photocrosslinkable polymers are oxygen sensitive. Consequently they tend to exhibit low photospeed and low contrast. To overcome these undesirable characteristics complicated oxygen scavenging schemes have been proposed. Very commonly a relatively thick polyvinyl alcohol overcoat is employed as an effective oxygen barrier layer. This additional step however, adds cost and complexity to the manufacturing and processing of the plate coating.

SUMMARY OF THE INVENTION

The present invention overcomes the problems noted above with a photosensitive composition comprising:

a) a resin containing ethylenically unsaturated photocrosslinkable groups, b) an ethylenically unsaturated photopolymerizable monomer, c) a photocrosslinkable polyester resin, d) a photoinitiator, and e) a thiazoline photosensitizer, the weight ratio of the total of resin a) and resin c) to monomer b) being at least 1.5:1, the resin a) having and of the structures I, II or III:

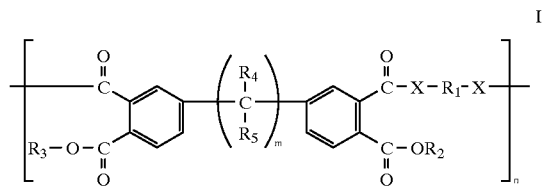

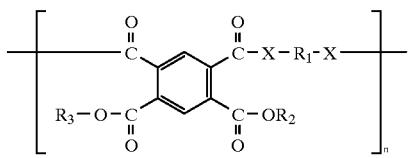

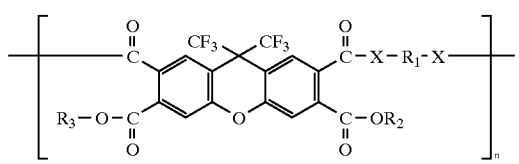

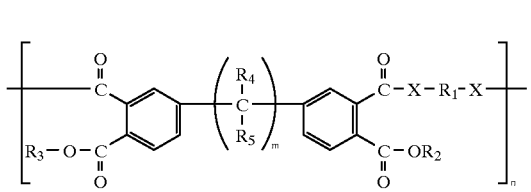

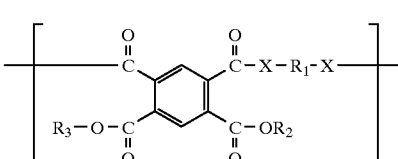

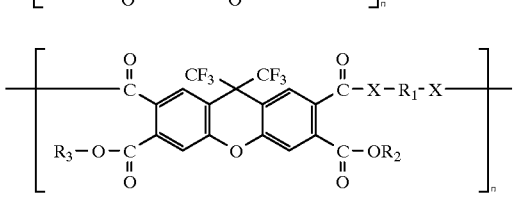

wherein X is —NH—, —O— or —S—, $R_1$ is a divalent aromatic, cycloaliphatic or aliphatic group having at least 2 carbon atoms, $R_2$ and $R_3$ are independently hydrogen or an organic radical containing a photopolymerizable olefinic double bond, provided at least one of $R_2$ and $R_3$ is the organic radical, $R_4$ and $R_5$ are independently a hydrocarbon having 1 to 8 carbon atoms, perfluoro, or a perhalofluoro aliphatic group having 1 to 8 carbon atoms, or together, $R_4$ and $R_5$ form an oxo group, m is 0 or 1, and n is a positive integer corresponding to the number of units in the polymer and is sufficiently large to provide the resin a) with a number average molecular weight of at least about 1500.

This invention also provides a photosensitive element comprising a support and having thereon a photosensitive image-forming layer, the photosensitive image-forming layer comprising the photosensitive composition described above.

The photocrosslinkable compositions of this invention have a number of advantages. They contain compatible polymers and polymerizable monomers, and can be used readily coated to provide single layer negative-working radiation sensitive elements such as photoresists and lithographic plates. The compositions are highly durable and chemically resistant when crosslinked, and are easily processed after exposure to remove nonimaged areas using many conventional aqueous developers. The compositions are not only photochemically curable, but also thermally curable to form a polyimide from resin a).

The photosensitive elements, such as lithographic plates formed using these compositions have high run length, and thus the user has an option of using them for any desired run length. The compositions and elements also have improved photospeed.

DETAILED DESCRIPTION OF THE INVENTION

The photosensitive composition of this invention has five essential components, the first being a resin (identified herein as "resin a") containing ethylenically unsaturated photocrosslinkable groups, and having any one of the structures I, II or III:

wherein X is —NH—, —O— or —S—, preferably, —NH— or —O—, and most preferably, —NH—.

$R_1$ is a divalent substituted or unsubstituted aromatic carbocyclic or heterocyclic group (such as arylene including naphthylene or phenylene, or pyridinylene), a divalent non-aromatic cycloaliphatic group (such as those having 5 to 15 carbon, sulfur, oxygen or nitrogen atoms, including cycloalkyl groups of 5 to 15 carbon atoms, and heterocyclic groups having 5 to 15 carbon and heteroatoms in the ring, including cyclohexylene, pyridinylene and pyridylene) or a divalent substituted or unsubstituted aliphatic group having at least 2 carbon atoms and including aromatic and non-aromatic groups that can also be connected with one or more oxy, amino, thio, carbonyl, oxycarbonyl, carbonyloxy, sulfonyl, sulfonyloxy or oxysulfonyl (such as alkylene, alkyleneoxyalkylene, alkyleneoxyarylene, arylenethioarylene, aryleneoxyarylene, arylenearylene, aryleneaminoarylene, aryleneoxyarylene, aryleneoxyalkylene and others readily apparent to one skilled in the art), or combinations of any of these. Preferably, $R_1$ is arylene or aryleneoxyarylene as defined above, and most preferably, $R_1$ is phenylene or phenyleneoxyphenylene.

$R_2$ and $R_3$ are independently hydrogen or a substituted or unsubstituted organic radical containing a photopolymerizable olefinic double bond (such as —CH=CH—CO— or equivalent groups where one or more of the hydrogen atoms is replaced with an alkyl group). Preferably, at least one of $R_2$ and $R_3$ (and more preferably, both) is an organic radical containing a photopolymerizable olefinic double bond that allows for crosslinking. The organic radical can include from 2 to 12 carbon, oxygen and sulfur atoms in the radical backbone, and can be substituted with various groups (such as hydroxy) that would be readily apparent to one skilled in the art. Particularly useful organic radicals are —CH$_2$CH$_2$OCOC(CH$_3$)=CH$_2$, —CH$_2$CH(OH)CH$_2$OCOC(CH$_3$)=CH$_2$ and their acrylate analogs. Other useful organic radicals are described in U.S. Pat. No. 4,416,973 (noted above).

$R_4$ and $R_5$ are independently a hydrocarbon having 1 to 8 carbon atoms (such as substituted or unsubstituted alkyl, cycloalkyl and aryl groups, each of which can be substituted with one or more hydrocarbon groups), perfluoro, or a perhalofluoro aliphatic group having 1 to 8 carbon atoms, or together, $R_4$ and $R_5$ form an oxo group. Preferably, $R_4$ and R$_5$ together form an oxo group. Perfluoro and perhalofluoro aliphatic groups designate groups that contain no hydrogen atoms, and wherein the all hydrogen atoms are substituted with fluoro or other halo atoms. A preferred perhalofluoro aliphatic group is trifluoromethyl, but others would be readily apparent to one skilled in the art.

In structure I, m is 0 or 1, and preferably, m is 1. Also, in each of the structures, n is a positive integer corresponding to the number of units in the polymer and is sufficiently large to provide resin a) with a number average molecular weight of at least about 1500. Preferably, n is sufficiently large to provide a number average molecular weight of from about 1500 to about 35,000, and more preferably, it is sufficiently large to provide a number average molecular weight of from about 2500 to about 25,000.

More details of useful resin a) materials, including methods of preparation, are described in U.S. Pat. No. 4,416,973 (noted above), incorporated herein by reference. Two or more of such resins can be used, if desired.

A second essential component of the composition of this invention is one or more ethylenically unsaturated photopolymerizable monomers. Particularly useful monomers are photosensitive acrylates including mono- and polyfunctional acrylates (including methacrylates). The polyfunctional acrylates are most preferred and include, but are not limited to, such compounds as trimethylol propane trimethacrylate, trimethylol propane triacrylate, trimethylol propane ethoxylated triacrylate, trimethylol propane polyethoxylated trimethacrylate, trimethylol propane polyethoxylated triacrylate, pentaerythritol triacrylate, polyethylene glycol diacrylate, triethylene glycol diacrylate, polyethylene glycol dimethacrylate, polymethylene diacrylate, polyethylene dimethacrylate, trimethylene glycol dimethacrylate, and mixtures thereof. Most preferred is pentaerythritol triacrylate. These materials are available from a number of commercial sources.

A photocrosslinkable polyester resin (or mixture thereof) is the third essential component of the composition of this invention. This resin typically has one or more photosensitive groups, such as a —CH═CH—CO— group. Such groups can be incorporated into the resin backbone, or be groups pendant to the resin backbone. Preferably, the photosensitive groups are an integral part of the resin backbone. The compounds also have aromatic groups.

Representative polyester resins can be prepared from one or more compounds represented by the following structures V–IX:

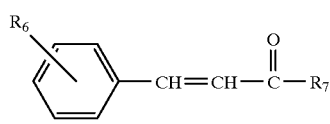

wherein R$_6$ is one or more substituted or unsubstituted alkyl groups having 1 to 6 carbon atoms, substituted or unsubstituted aryl having 6 to 12 carbon atoms, substituted or unsubstituted aralkyl having 7 to 20 carbon atoms, substituted or unsubstituted alkoxy having 1 to 6 carbon atoms, nitro, amino, acrylic, carboxyl, or halo, and is chosen to provide at least one condensation site. R$_7$ is hydroxy, substituted or unsubstituted alkoxy having 1 to 6 carbon atoms, halo or oxy if the compound is an acid anhydride. A preferred compound of structure V is p-phenylene diacrylic acid or a functional equivalent thereof. These and other useful compounds are described in the Schellenberg et al, Laakso and Allen patents noted above, all disclosures of which are incorporated herein by reference.

Structure VI:

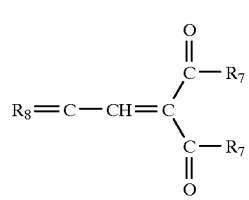

wherein R$_7$ is as defined above, and R$_8$ is substituted or unsubstituted alkylidene having 1 to 4 carbon atoms, substituted or unsubstituted aralkylidene having 7 to 16 carbon atoms or a 5- or 6-membered heterocyclic ring. Particularly useful compounds of structure VI include, but are not limited to, cinnamylidenemalonic acid, 2-butenylidenemalonic acid, 3-pentenylidenemalonic acid, o-nitrocinnamylidenemalonic acid, naphthylallylidenemalonic acid, 2-furfurylideneethylidenemalonic acid and functional equivalents thereof. These and other useful compounds are described in U.S. Pat. No. 3,674,745 (Philipot et al), the disclosure of which is incorporated herein by reference.

Structure VII:

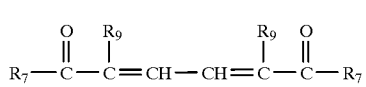

wherein R$_7$ is as defined above, and R$_9$ is hydrogen or methyl. Particularly useful compounds of structure VII are trans, trans-muconic acid, cis, trans-muconic acid, cis, cis-muconic acid, α,α'-cis, trans-dimethylmuconic acid, α,α'-cis, cis-dimethylmuconic acid and functional equivalents thereof. These and other useful compounds are described in U.S. Pat. No. 3,615,434 (McConkey), the disclosure of which is incorporated herein by reference.

Structure VIII:

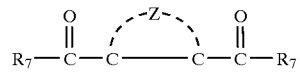

wherein R$_7$ is as defined above, and Z represents the atoms necessary to form an unsaturated bridged or unbridged, substituted or unsubstituted carbocyclic nucleus of 6 or 7 carbon atoms. Particularly useful compounds of structure VIII include, but are not limited to, 4-cyclohexene-1,2-dicarboxylic acid, 5-norbornene-2,3-dicarboxylic acid, hexachloro-5[2:2:1]-bicycloheptene-2,3-dicarboxylic acid and functional equivalents thereof. These and other useful compounds are described in Canadian Patent 824,096 (Mench et al), the disclosure of which is incorporated herein by reference.

Structure IX:

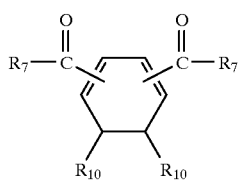

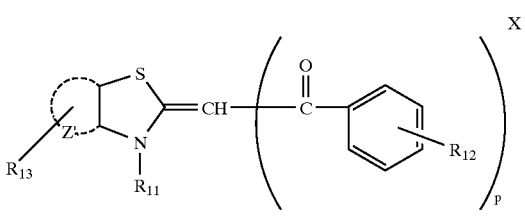

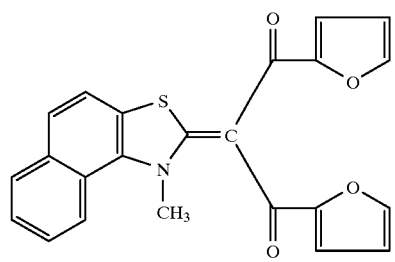

wherein $R_7$ is as defined above, and $R_{10}$ is hydrogen, substituted or unsubstituted alkyl having 1 to 12 carbon atoms, substituted or unsubstituted cycloalkyl having 5 to 12 carbon atoms or substituted or unsubstituted aryl having 6 to 12 carbon atoms. $R_{10}$ can be substituted with any group that does not interfere with the condensation reaction, such as halo, nitro, aryl, alkoxy, aryloxy and other readily apparent to those skilled in the art. Particularly useful compounds include, but are not limited to, 1,3-cyclohexadiene-1,4-dicarboxylic acid, 1,3-cyclohexadiene-1,3-dicarboxylic acid, 1,5-cyclohexadiene-1,4-dicarboxylic acid and functional equivalents thereof. These and other useful compounds are described, for example, in Belgian Patent 754,892, the disclosure of which is incorporated herein by reference.

Preferred photocrosslinkable polyesters for use in this invention are the p-phenylene diacrylate polyesters.

Photoinitiators useful in the practice of this invention include, but are not limited to, aromatic biimidazoles, aromatic ketones, benzoin, benzoin ethers, mercaptobenzothiazoles, mercaptobenzoxazones, and active halogen compounds, as described for example in U.S. Pat. No. 4,416,973 (noted above) and U.S. Pat. No. 4,505,793 (Tamoto et al), the disclosures of which are incorporated herein by reference.

Particularly useful photoinitiators include the halogenated triazines that are substituted with at least one trihalomethyl group. Such compounds are described in more detail in the noted Tamoto et al patent. Representative compounds include, but are not limited to, 2-phenyl-4,6-bis(trichloromethyl)-s-triazine, 2-(p-chlorophenyl)-4,6-bis(trichloromethyl)-s-triazine, 2-(p-tolyl)-4,6-bis(trichloromethyl)-s-triazine, 2-(p-methoxyphenyl)-4,6-bis(trichloromethyl)-s-triazine, 2-(2',4'-dichlorophenyl)-4,6-bis(trichloromethyl)-s-triazine, 2,4,6-tris(trichloromethyl)-s-triazine, 2-methyl-4,6-bis(trichloromethyl)-s-triazine, 2-n-nonyl-4,6-bis(trichloromethyl)-s-triazine, and 2-(α,α,β-trichloroethyl)-4,6-bis(trichloromethyl)-s-triazine. In addition, there can be mentioned the compounds described in GB 1,388,492, for example, 2-styryl-4,6-bis(trichloromethyl)-s-triazine, 2-(p-methylstyryl)-4,6-bis(trichloromethyl)-s-triazine, 2-(p-methoxystyryl)-4,6-bis(trichloromethyl)-s-triazine, and 2-(p-methyoxystyryl)-4-amino-6-trichloromethyl-s-triazine. Moreover, the compounds described in *J. Org. Chem.* Vol. 29, page 1527 (1964), for example, 2-methyl-4,6-bis(tribromomethyl)-s-triazine, 2,4,6-tris(tribromomethyl)-s-triazine, 2,4,6-tris(dibromomethyl)-s-triazine, 2-amino-4-methyl-6-tribromomethyl-s-triazine, and 2-methoxy-4-methyl-6-trichloromethyl-s-triazine. Such compounds are readily available from a number of commercial sources.

A most preferred halogenated triazine photoinitiator is bis(trichloromethyl)-1-naphthyltriazine or its 4-methoxy derivative.

Photosensitizers useful in the practice of this invention are aromatic thiazoline compounds, such as those described for example in U.S. Pat. No. 2,732,301 (Robertson et al).

More particularly, the photosensitizers have the following structure X or XI:

wherein $R_{11}$ is alkyl of 1 to 4 carbon atoms, $R_{12}$ and $R_{13}$ are independently hydrogen, alkyl of 1 to 4 carbon atoms, sulfonic acid (or a salt thereof), chloro or nitro. Preferably, $R_{11}$ is methyl or ethyl, and $R_{12}$ and $R_{13}$ are independently hydrogen or methyl. More preferably, $R_{11}$ is methyl and $R_{12}$ is hydrogen.

Also in structure X, p is 1 or 2, and preferably, p is 1.

Z' represents the carbon atoms necessary to complete a 6- to 10-membered aromatic ring fused with the thiazoline ring. This aromatic ring thus can form a phenyl or naphthyl fused ring; and can be unsubstituted or substituted with one or more alkyl, alkoxy or nitro groups. Preferably, the ring is an unsubstituted naphthyl ring fused with the thiazoline ring.

Representative compounds of structure X or XI that can be used as photosensitizers include, but are not limited to, N-methyl-2-benzoylmethylene-β-naphthothiazoline, N-ethyl-2-benzoylmethylene-β-naphthothiazoline, N-methyl-2-(m-sulfonylbenzoyl)methylene-β-naphthothiazoline pyridinium salt, N-methyl-2-m-chlorobenzoylmethylene-β-naphthothiazoline, N-methyl-2-p-nitrobenzoylmethylene-β-naphthothiazoline, and N-methyl-2-bis(1'-furanoyl)methylene-β-naphthothiazoline. The first compound is most preferred.

In the compositions of this invention, resin a) comprises from about 15 to about 65%, the polymerizable monomer comprises from about 15 to about 50%, the photocrosslinkable polyester comprises from about 15 to about 65%, the photoinitiator comprises from about 0.5 to about 15%, and the photosensitizer comprises from about 0.2 to about 6%, all based on dry coating weight. Preferable amounts include from about 30 to about 50% of resin a), from about 25 to about 50% of the polymerizable monomer, from about 30 to about 50% of the photocrosslinkable polyester, from about 2 to about 12% of the photoinitiator, and from about 1 to about 6% of the photosensitizer, all based on dry coating weight.

The weight ratio of the total (that is, the sum of weights) of resin a) and resin c) to the monomer b) in the composition is at least 1.5:1, and preferably, at least 2.25:1. Generally, a useful weight ratio range is from about 1.5:1 to about 5:1, with a range of from about 2.25 to about 4:1 being preferred.

The compositions of this invention can also include one or more surfactants, stabilizers, dyes or pigments, plasticizers, binders, anti-scumming agents, antioxidants, extenders, and other addenda commonly employed in such compositions, especially when they are used to prepare photoresists and lithographic printing plates. Such addenda can be included in conventional amounts.

It is frequently desirable to add print out or indicator dyes to the photosensitive compositions to provide a colored print out image after exposure. Useful indicator dyes are well known in the art, as described for example in U.S. Pat. No. 5,043,250 (West et al).

The photosensitive compositions of this invention can be prepared by dissolving or dispersing the components in one or more suitable solvents that are commonly employed in the art to prepare polymer dopes. The solvents are chosen to be substantially unreactive toward the polymers and monomer within the time period contemplated for maintaining the solvent(s) and polymers in association, and are chosen to be compatible with the substrate employed for coating. While the best choice of solvent will vary with the exact application under consideration, exemplary preferred solvents include alcohols (such as butanol, benzyl alcohol and 1-methoxy-2-propanol), ketones (such as acetone, 2-butanone and cyclohexanone), butyrolactone, ethers (such as tetrahydrofuran and dioxane), 2-methoxyethyl acetate, N,N'-dimethylformamide, chlorinated hydrocarbons (such as chloroform, trichloroethane, dichloroethane, tetrachloroethane and chlorobenzene), hydrocarbons (such as toluene, xylene and mesitylene). Mixtures of various solvents are preferred since there are several polymeric components in the composition of the invention. For example, a preferred mixture includes toluene, tetrahydrofuran, 1-methoxy-2-propanol and butyrolactone.

The photosensitive elements of this invention include electrical or electronic devices such as semiconductors, capacitors and printed circuits, and lithographic printing plates. Preferred elements are negative-working lithographic printing plates.

The photosensitive elements comprise a support having thereon a layer containing the photosensitive composition of this invention. Such elements can be prepared by forming coatings with the compositions and removing solvent(s) by drying at ambient or elevated temperatures. Any one of a variety of conventional coating techniques can be employed, such as extrusion coating, doctor-blade coating, spray coating, dip coating, whirl coating, spin coating, roller coating and other procedures known in the art.

Suitable supports can be chosen from a wide variety of materials that do not directly chemically react with the coating compositions. Such supports include, but are not limited to, fiber based materials (such as paper, polyethylene-coated papers, polypropylenecoating papers, parchment and cloth), metal sheets and foils (such as aluminum, steel, silver, zinc, copper, gold and platinum), glass and glass coated metals (such as chromium alloys), synthetic resins and polymeric materials [such as poly(alkyl acrylates), poly(alkyl methacrylates), polyesters, poly(vinyl acetals), polyamides, cellulose nitrate, cellulose esters and the like]. Preferred support materials include zinc, anodized aluminum, grained aluminum, and aluminum that has been both anodized and grained, as described in U.S. Pat. No. 4,647,346 (Miller et al) and U.S. Pat. No. 4,865,951 (Huddleston et al), the disclosures of which are incorporated herein by reference.

The support can be preliminarily treated or coated before application of the photosensitive coating of this invention. Known subbing layers can be used if desired, including copolymers of vinylidene chloride and acrylic monomers (such as acrylonitrile, methyl acrylate and methyl methacrylate) and unsaturated dicarboxylic acids (such as itaconic acid and benzoic acid), carboxymethyl cellulose, gelatin, polyacrylamide and similar materials.

The optimum coating thickness of the photosensitive layer will depend upon such factors as the particular application to which the element will be put, and the nature of the various components in the layer. Typical coating thicknesses can be from about 0.05 to about 10 m$\mu$ or greater, with thicknesses of from about 0.1 to about 2.5 m$\mu$ being preferred. A protective overcoat prepared from conventional polymers can be used if desired.

In a preferred embodiment of this invention, a lithographic printing plate comprises an anodized aluminum support and has thereon a photosensitive image-forming layer and a protective overcoat layer, the photosensitive image-forming layer comprising:

a) a polyamide containing ethylenically unsaturated photocrosslinkable groups, b) pentaerythritol triacrylate, c) a photocrosslinkable polyester resin containing aromatic groups having linked thereto photosensitive —CH=CH—CO— or equivalent groups, and d) a halogenated triazine, and e) photosensitizer of the structure X

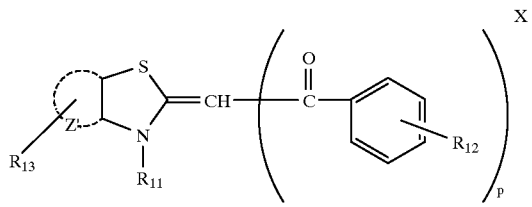

wherein $R_{11}$ is methyl or ethyl, and $R_{12}$ and $R_{13}$ are independently hydrogen or methyl, p is 1 or 2, Z' represents the carbon atoms necessary to complete an unsubstituted phenyl or naphthyl ring fused with the thiazoline ring, the weight ratio of the total of resin a) and resin c) to the monomer b) being from 2.25:1 to 4:1, the resin a) having structure XI:

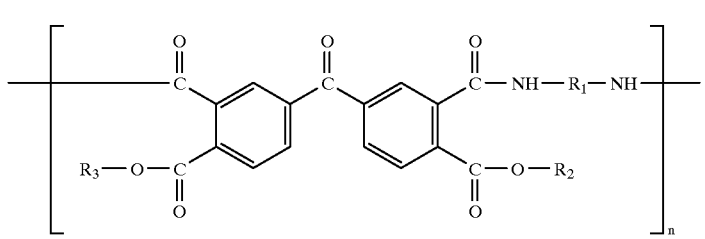

wherein $R_1$ is phenylene or phenyleneoxyphenylene, $R_2$ and $R_3$ are each —$CH_2CH_2OCO(CH_3)$=$CH_2$—, and n is a positive integer corresponding to the number of units in the polymer and is sufficiently large to provide said resin a) with a number average molecular weight of from about 1500 to about 35,000.

The elements of this invention can be exposed and processed using conventional procedures and conditions, as described for example in U.S. Pat. No. 5,141,842 (Mitchell et al), the disclosure of which is incorporated herein by reference.

Exposed printing plates can be developed by flushing, soaking, swabbing or otherwise treating the crosslinked photosensitive layer with a developing solution which selectively removes (that is, solubilizes) the unexposed areas of the layer. The developer is preferably an aqueous solution having a pH near neutral. In a preferred form, the developing solution includes a combination of water and an alcohol that is water-miscible, or is rendered water-miscible with a co-solvent or surfactant. Various useful solvents are known in the art. The developing solutions can also contain various addenda, such as surfactants, dyes and/or pigments, anti-scumming agents as are well known in the art.

After development, the elements can be treated in any known manner consistent with its intended use. For example, lithographic printing plates are typically subjected to desensitizing etches or finishing solutions.

The following examples illustrate the present invention and are not meant to be limiting in any way. All percentages are by weight, unless otherwise noted.

EXAMPLE 1

A photosensitive composition of this invention was prepared by mixing the following components in a solvent-based formulation (weight % of wet formulation):

| | |
|---|---|
| Pentaerythritol triacrylate (Nippon Kayaku) | 2.01% |
| Polyamic acid ester* (DuPont KG-10602) | 2.41% |
| Bis(trichloromethyl)-1-naphthyltriazine | 0.49% |
| N-Methyl-2-benzoylmethylene-β-naphthothiazoline photosensitizer (Eastman Kodak) | 0.25% |
| Photosensitive polyester** (Eastman Kodak) | 1.88% |
| 3-t-Butyl-4-hydroxy-5-methyl-phenyl sulfide stabilizer (Aldrich Chemicals) | 0.01% |
| Victoria Blue (Charkit) | 0.07% |
| Methyl Violet (Charkit) | 0.07% |
| FC-430 surfactant (3M) | 0.01% |
| BYK 307 coating aid (BYK) | 0.01% |
| Butyrolactone | 13.70% |
| Tetrahydrofuran | 23.46% |
| Toluene | 11.46% |
| 1-Methoxy-2-propanol | 44.17% |

*
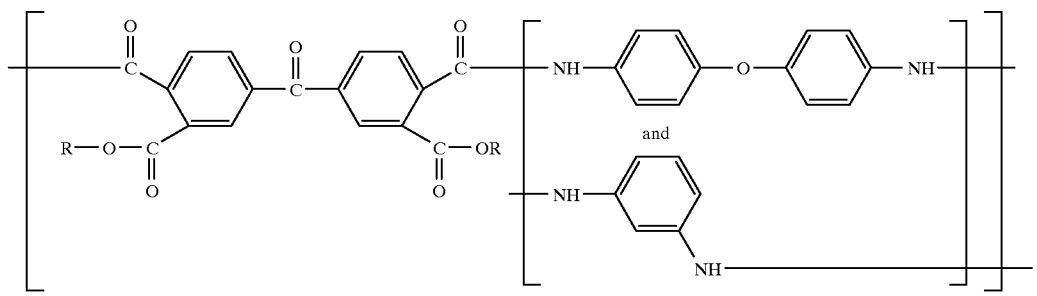

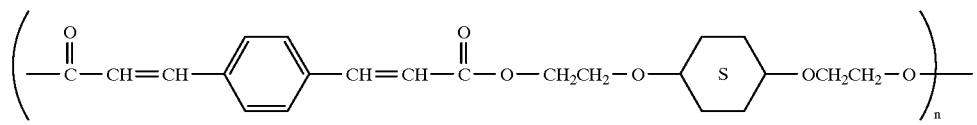

EXAMPLE 2

Lithographic Printing Plate

The composition of Example 1 was coated on electrochemically grained and anodized aluminum support that had been treated with polyvinylphosphonic acid. The resulting photosensitive layer was dried to provide a photosensitive layer having a thickness of about 1.5 m$\mu$.

The plate was contact exposed for 40 units through a commercial vacuum exposing frame (OLEC). The exposed coating was machine processed through a KODAK N-85 Processor at a rate of 0.9 m/min using the KODAK Production Series Negative Developer. The processed plate, finished with the KODAK AQUA IMAGE Plate Finisher, exhibited high contrast images with excellent Photospeed (see Table I below).

EXAMPLES 2–4

Photosensitive Compositions With Other Naphthiothiazolines

Compositions and plates identical to that in Example 1 were prepared and similarly evaluated, except that the photosensitizer was replaced by N-ethyl BNTZ (Example 2), the BNTZ pyridinium salt (Example 3) and the bisfuranoyl NTZ (Example 4).

The photospeed for each example as measured by the number of solid steps on a KODAK T-14 step tablet and summarized in Table I, were found to be excellent, good to acceptable.

TABLE I

| | Naphthothiazoline Sensitizers | |
|---|---|---|
| Example | Photosensitizer | Photospeed (T-14 Solid Steps) |
| 1 | N-Me BNTZ | 5 |
| 2 | N-Et BNTZ | 3 |
| 3 | N-Me BNTZ pyridinium salt | 2 |
| 4 | BFNTZ | 3 |

COMPARATIVE EXAMPLES (CONTROLS A–E)

Use of Other Photosensitizers

Composition and plates identical to those in Example 1 were prepared and evaluated, except the photosensitizer was either omitted (Control A), or replaced by tetra-n-propoxy ketocoumarin (KC-74), Control B), thioxanthone (TX, Control C), 2,3-diethyl thioxanthone (DETX, Control D), and XSE-1003 (Control E). The latter is a mixture of octyl and ethylhexyl esters of thioxanthone-3,4-dicarboxylic acid and a photosensitizer commercialized by Ciba-Geigy.

The results are tabulated in Table II below and indicate that compared to the plates of this invention, the control plates exhibited much poorer photospeed.

TABLE II

| Plates | Photosensitizer | Photospeed (T-14 solid steps) |
|---|---|---|
| Control A | None | 1 |
| Control B | KC-74 ketocoumarin | 1 |
| Control C | TX (thioxanthone) | 1 |
| Control D | DETX (Diethyl thioxanthone) | 1 |
| Control E | XSE-1003 (thioxanthone diester) | 1 |

The invention has been described in detail with particular reference to preferred embodiments thereof, but it will be understood that variations and modifications can be effected within the spirit and scope of the invention.

I claim:

1. A photosensitive composition comprising:

a) a resin containing ethylenically unsaturated photocrosslinkable groups, b) an ethylenically unsaturated photopolymerizable monomer, c) a photocrosslinkable polyester resin, d) a halogenated triazine photoinitiator, and e) an aromatic thiazoline photosensitizer, the weight ratio of the total of said resin a) and resin c) to said monomer b) being at least 1.5:1, said resin a) having any of structures I, II or III:

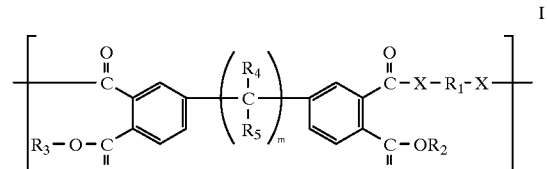

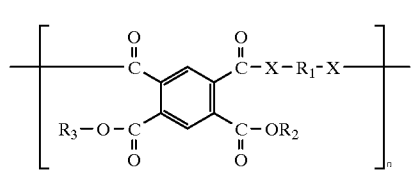

-continued

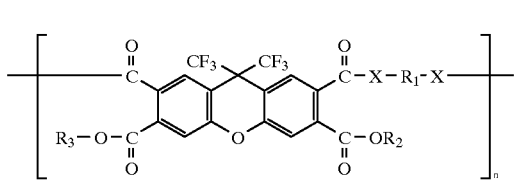
III wherein X is —NH— or —O—,

R₁ is a divalent aromatic, cycloaliphatic or aliphatic group having at least 2 carbon atoms, R₂ and R₃ are independently hydrogen or an organic radical containing a photopolymerizable olefinic double bond, provided at least one of R₂ and R₃ is said organic radical, R₄ and R₅ are independently, a hydrocarbon having 1 to 8 carbon atoms, perfluoro, or a perhalofluoro aliphatic group having 1 to 8 carbon atoms, or together, R₄ and R₅ form an oxo group, m is 0 or 1, and n is a positive integer corresponding to the number of units in the polymer and is sufficiently large to provide said resin a) with a number average molecular weight of at least about 1500.

2. The composition of claim 1 wherein R₁ is arylene or aryleneoxyarylene.

3. The composition of claim 2 wherein R₂ and R₃ are each an organic radical containing a photopolymerizable olefinic double bond.

4. The composition of claim 1 wherein R₄ and R₅ are each a perfluoro aliphatic group or together form an oxo group.

5. The composition of claim 1 wherein n is a positive integer sufficiently large to provide said resin a) with a number average molecular weight of from about 1500 to about 35,000.

6. The composition of claim 1 wherein said monomer is a polyacrylate.

7. The composition of claim 6 wherein said polyacrylate is pentaerythritol triacrylate.

8. The composition of claim 1 wherein said photo-crosslinkable polyester resin has aromatic groups and a photosensitive —CH=CH—CO— group.

9. The composition of claim 1 wherein said photosensitizer has the structure X or XI:

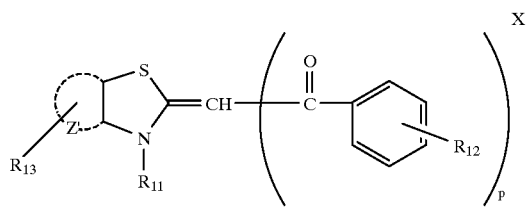
X

-continued

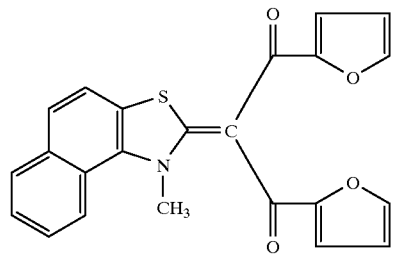
XI wherein R₁₁ is an alkyl or 1 to 4 carbon atoms, and R₁₂ and R₁₃ are independently hydrogen, alkyl of 1 to 4 carbon atoms, sulfonic acid or a salt thereof, chloro or nitro, p is 1 or 2, and Z' represents the carbon atoms necessary to complete a 6- to 10-membered aromatic ring system fused with the thiazoline ring.

10. The composition of claim 9 wherein R₁₁ is methyl or ethyl, and R₁₂ and R₁₃ are independently hydrogen or methyl, p is 1, and Z' completes a naphthyl or phenyl ring with said thiazoline nucleus.

11. The composition of claim 10 wherein said photosensitizer is selected from the group consisting of N-methyl-2-benzoylmethylene-β-naphthothiazoline, N-ethyl-2-benzoylmethylene-β-naphthothiazoline, N-methyl-2-(m-sulfonylbenzoyl)methylene-β-naphthothiazoline pyridinium salt, N-methyl-2-m-chlorobenzoylmethylene-β-naphthothiazoline, N-methyl-2-p-nitrobenzoylmethylene-β-naphthothiazoline, and N-methyl-2-bis(1'-furanoyl) methylene-β-naphthothiazoline.

12. The composition of claim 12 wherein said photosensitizer is N-methyl-2-benzoylmethylene-β-naphthothiazoline.

13. The composition of claim 1 wherein the weight ratio of the total of said resin a) and resin c) to said monomer b) is at least 2.25:1.

14. The composition of claim 1 wherein the weight ratio of the total of said resin a) and resin c) to said monomer b) is from 1.5:1 to 5:1.

15. The composition of claim 1 wherein X is —NH—.

16. A photosensitive element comprising a support and having thereon a photosensitive image-forming layer, said photosensitive image-forming layer comprising:
   a) a resin containing ethylenically unsaturated photocrosslinkable groups,
   b) an ethylenically unsaturated photopolymerizable monomer,
   c) a photocrosslinkable polyester resin,
   d) a photoinitiator, and
   e) an aromatic thiazoline photosensitizer,
   the weight ratio of the total of said resin a) and resin c) to said monomer b) being at least 1.5:1,
   said resin a) having any of structures I, II or III:

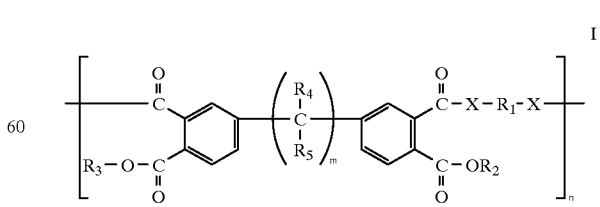
I

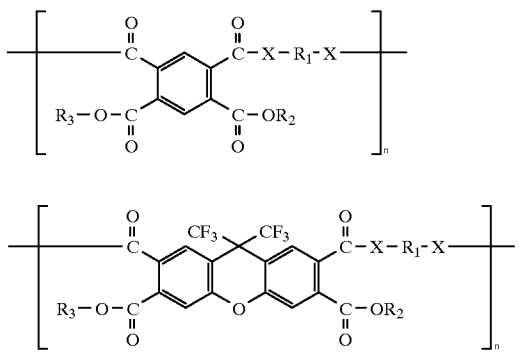

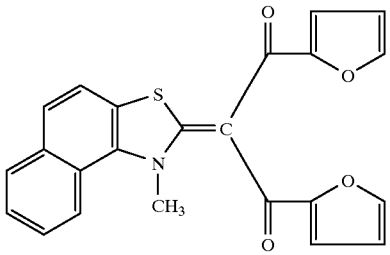

wherein X is —NH— or —O—,

R$_1$ is a divalent aromatic, cycloaliphatic or aliphatic group having at least 2 carbon atoms, R$_2$ and R$_3$ are independently hydrogen or an organic radical containing a photopolymerizable olefinic double bond, provided at least one of R$_2$ and R$_3$ is said organic radical, R$_4$ and R$_5$ are independently, a hydrocarbon having 1 to 8 carbon atoms, perfluoro, or a perhalofluoro aliphatic group having 1 to 8 carbon atoms, or together, R$_4$ and R$_5$ form an oxo group, m is 0 or 1, and n is a positive integer corresponding to the number of units in the polymer and is sufficiently large to provide said resin a) with a number average molecular weight of at least about 1500.

17. The photosensitive element of claim 16 wherein R$_1$ is arylene or aryleneoxyarylene, at least one of R$_2$ and R$_3$ is an organic radical containing a photopolymerizable double bond, R$_4$ and R$_5$ are each a perfluoro aliphatic group or together form an oxo group, and n is a positive integer sufficiently large to provide said resin a) with a number average molecular weight of from about 1500 to about 35,000.

18. The photosensitive element of claim 17 wherein X is —NH—.

19. The photosensitive element of claim 16 wherein said monomer is pentaerythritol triacrylate, said photocrosslinkable polyester resin has aromatic and photosensitive —CH=CH—CO— groups, and said photosensitizer has the structure X or XI:

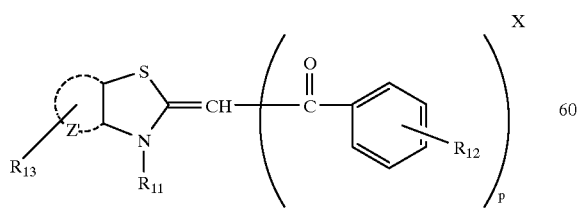

wherein R$_{11}$ is an alkyl of 1 to 4 carbon atoms, and R$_{12}$ and R$_{13}$ are independently hydrogen, alkyl of 1 to 4 carbon atoms, sulfonic acid or a salt thereof, chloro or nitro, p is 1 or 2, and Z' represents the carbon atoms necessary to complete a 6- to 10-membered aromatic ring system fused with the thiazoline ring.

20. The photosensitive element of claim 19 wherein said ring system is phenyl or naphthyl, and wherein said ring system is unsubstituted or substituted with one or more alkyl, alkoxyl, or nitro groups.

21. The photosensitive element of claim 16 that is a lithographic printing plate wherein the weight ratio of the total of said resin a) and resin c) to said monomer b) is at least 2.25:1.

22. The lithographic printing plate of claim 21 wherein said support is a treated or untreated aluminum support.

23. The lithographic printing plate of claim 21 further comprising a protective overcoat.

24. The photosensitive element of claim 16 wherein X is —NH—.

25. A lithographic printing plate comprising an anodized or grained aluminum support and having thereon a photosensitive image-forming layer and a protective overcoat layer, said photosensitive image-forming layer comprising:

a) a polyamide containing ethylenically unsaturated photocrosslinkable groups, b) pentaerythritol triacrylate, c) a photocrosslinkable polyester resin containing aromatic groups and photosensitive —CH=CH—CO— groups, d) a halogenated triazine photoinitiator, and e) as a photosensitizer, selected from the group consisting of N-methyl-2-benzoylmethylene-β-naphthothiazoline, N-ethyl-2-benzoylmethylene-β-naphthothiazoline, N-methyl-2-(m-sulfonylbenzoyl)methylene-β-naphthothiazoline pyridinium salt, N-methyl-2-m-chlorobenzoylmethylene-β-naphthothiazoline, N-methyl-2-p-nitrobenzoylmethylene-β-naphthothiazoline, and N-methyl-2-bis(1'-furanoyl)methylene-β-naphthothiazoline, the weight ratio of the total of said resin a) and resin c) to said monomer b) being from 2.25:1 to 4:1, said resin a) having structure XII:
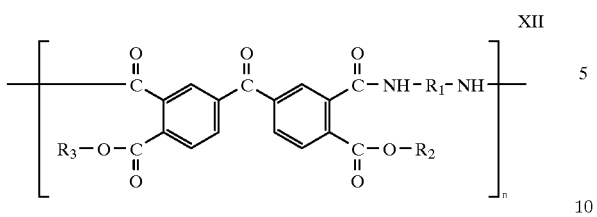
XII
wherein $R_1$ is phenylene or phenyleneoxyphenylene,
$R_2$ and $R_3$ are each —$CH_2CH_2OCO(CH_3)$=$CH_2$,
n is a positive integer corresponding to the number of units in the polymer and is sufficiently large to provide said resin a) with a number average molecular weight of from about 1500 to about 35,000.
* * * * *